(12) United States Patent
Shen et al.

(10) Patent No.: US 7,097,922 B2
(45) Date of Patent: Aug. 29, 2006

(54) MULTI-LAYERED SUPERHARD NANOCOMPOSITE COATINGS

(75) Inventors: Yaogen Shen, Hong Kong Sar (CN); Yiu-Wing Mai, Glebe Point (AU); Lawrence Kwok-Yan Li, Hong Kong Sar (CN); Tai Lun Chan, Troy, MI (US); Simon Chin-Yu Tung, Rochester Hills, MI (US)

(73) Assignees: General Motors Corporation, Detroit, MI (US); City University of Hong Kong, Kowloon (HK)

( * ) Notice: Subject to any disclaimer, the term of this patent is extended or adjusted under 35 U.S.C. 154(b) by 0 days.

(21) Appl. No.: 10/837,875

(22) Filed: May 3, 2004

(65) Prior Publication Data

US 2006/0147728 A1 Jul. 6, 2006

(51) Int. Cl.
*B32B 9/00* (2006.01)

(52) U.S. Cl. ...................... 428/701; 428/698

(58) Field of Classification Search ................ 501/96, 501/90, 97; 428/698, 216, 446
See application file for complete search history.

(56) References Cited

U.S. PATENT DOCUMENTS 4,441,894 A * 4/1984 Sarin et al. .................. 51/295
4,469,801 A * 9/1984 Hirai et al. ................. 428/698
5,182,238 A * 1/1993 Holleck ...................... 428/698
5,376,599 A * 12/1994 Oshima et al. ............... 501/90
5,677,252 A * 10/1997 Gilde et al. ................ 501/96.5
6,037,243 A * 3/2000 Ha et al. .................... 438/528
6,124,638 A * 9/2000 Iwasa ........................ 257/751
6,436,825 B1 * 8/2002 Shue ......................... 438/687
6,440,590 B1 * 8/2002 Nomura et al. ............. 428/698
6,475,912 B1 * 11/2002 Harada ...................... 438/687

FOREIGN PATENT DOCUMENTS

EP    0220839 A1 *  5/1987

OTHER PUBLICATIONS

Diserens (Surface and Coating Technology 108-109 (1998) 241-246).*

* cited by examiner

*Primary Examiner*—Jennifer C. McNeil
*Assistant Examiner*—Daniel Miller
(74) *Attorney, Agent, or Firm*—Kathryn A. Marra

(57) ABSTRACT

Superhard nanocomposite coatings which are applicable to coating contact surfaces on substrates in a variety of industrial processes are disclosed. In a typical embodiment, the superhard nanocomposite coating includes a refractory metal silicon nitride coating layer having silicon in a concentration of from about 6 atomic percent to about 12 atomic percent.

11 Claims, 8 Drawing Sheets

MULTI-LAYERED SUPERHARD NANOCOMPOSITE COATINGS

FIELD OF THE INVENTION

The present invention relates to protective coatings for substrates in industrial processes. More particularly, the present invention relates to multi-layered, superhard nanocomposite coatings having a Ti—Si—N coating film which exhibits improved substrate adhesion, friction and wear-resistance properties.

BACKGROUND OF THE INVENTION

Materials having fine-scale microstructures have long been recognized to exhibit technologically-attractive properties. Recently, there has been developed a new class of microstructure materials, known as "nanostructured materials", which are characterized by ultra-fine grains or particles embedded in a matrix. In nanostructured materials, a high fraction of the material's atoms are located at the boundaries of the grains or particles in the matrix.

In the past, research involving nanostructured materials has focused on the synthesis and processing of nanostructured bulk materials. Currently, however, there is a growing interest in nanostructured coatings including thermal barrier coatings, hard coatings and superhard nanocomposite coatings. A nanocomposite coating is a coating having more than one solid phase, at least one of which is in the nanometer range. Recent attention has been directed to nanocomposites due to the unique properties exhibited by these materials.

Titanium nitride (TiN) has been used as a protective and decorative coating in a variety of industries due to its high hardness, enhanced wear- and corrosion-resistant capability and golden color. However, due in large part to their low oxidation resistance at high temperatures, TiN coatings have some limitations under high-speed and dry-machining conditions. Silicon has been added to TiN coatings to form a stable oxide, preventing the coatings from undergoing severe oxidation. Besides their improved thermal stability, Ti—Si—N nanocomposite coatings exhibit enhanced hardness (over 40 GPa) as compared to TiN coatings (about 20 GPa). Ti—Si—N nanocomposite coating films have been characterized by nanocrystalline titanium nitride grains or particles embedded in a silicon nitride matrix.

In the past, nanocomposite Ti—Si—N films have been successfully synthesized using chemical vapor deposition (CVD), plasma-induced CVD and physical vapor deposition (PVD) techniques, as well as other methods. Recently, attention has been drawn to the PVD method because its hazard-free deposition process is safer and more compatible with industry application as compared to other deposition techniques. RF- and DC-supplied reactive unbalanced magnetron PVD sputtering has reportedly been found an effective technique for the fabrication of Ti—Si—N coatings.

In recent years, research efforts have focused on the relationship between coating structure and deposition conditions as indicative of the enhanced physical characteristics of Ti—Si—N nanocomposite coatings. Physical, structural and mechanical properties of Ti—Si—N coatings were characterized and a new structural model was introduced to explain the hardness enhancement mechanism. However, tribological properties are as relevant to the performance of protective coatings as are physical, structural and mechanical properties.

The super-hardness of recently-developed nanocomposite materials is a combined result of the stabilities of their nanostructure and interface. Therefore, thermal stability of nanocomposites is crucial for the stability of their hardness. The hardness of nanocrystalline/amorphous materials depends on four factors: (i) microstructure grains (grain size and texture of nanocrystallites), (ii) the chemical composition of each phase, (iii) the residual stress of the coatings, and (iv) the substrate temperature during coating deposition.

Recent research has shown the feasibility of synthesizing two-phase nanocomposite films with microstructures including nanocrystalline grains in an amorphous matrix. For example, nanocomposite TiN and $SiN_x$ films with hardness of 30–40 GPa have been synthesized by plasma-enhanced chemical vapor deposition (PECVD) and reactive magnetron sputtering. However, it has been found that the addition of controlled quantities of Si into a growing TiN film creates a diffusive barrier which blocks dislocations and suppresses plastic deformation. The result is a Ti—Si—N nanocomposite film with improved mechanical properties.

SUMMARY OF THE INVENTION

The present invention is directed to multi-layer superhard nanocomposite coatings which are applicable to coating contact surfaces on substrates in a variety of industrial processes. In a typical embodiment, the multi-layer superhard nanocomposite coating of the present invention is formed as a multi-layered coating structure including an interlayer deposited on a substrate; a base layer deposited on the interlayer; a transition layer deposited on the base layer; and a superficial coating layer deposited on the transition layer. The superficial coating layer is a two-phase refractory metal-silicon-nitride nanocomposite film. Typically, the superficial coating layer is a Ti—Si—N nanocomposite film with microstructures having nanocrystalline grains of titanium nitride (TiN) in an amorphous matrix of silicon nitride (SiN). The silicon is incorporated into the film at a concentration of typically about 6~12 at. % to provide a film hardness of typically about 30~40 GPa. The invention is applicable to coating contact surfaces on substrates in a variety of industries, including drilling, milling and other machining operations which require the use of superhard-coated drills or cutting tool inserts, for example.

BRIEF DESCRIPTION OF THE DRAWINGS

The invention will now be described, by way of example, with reference to the accompanying drawings, in which.

DETAILED DESCRIPTION OF THE INVENTION

The present invention contemplates multi-layer superhard nanocomposite coatings which can be applied to a substrate or contact surface in any of a variety of industrial processes including drilling, milling and other machining operations that require the use of superhard-coated drills or cutting tool inserts, for example. The superhard nanocomposite coatings of the present invention are typically formed as a multi-layered coating structure having an interlayer deposited on a substrate, a base layer deposited on the interlayer, a transition layer deposited on the base layer and a superficial coating layer deposited on the transition layer. The superficial coating layer is a two-phase refractory metal-silicon-nitride nanocomposite film with microstructures having nanocrystalline grains of refractory metal nitride in an amorphous matrix of silicon nitride (SiN). Refractory metals suitable for carrying out the invention include titanium (Ti), tantalum (Ta) or tungsten (W), for example. Typically, the refractory metal is titanium, wherein the superficial coating layer is a two-phase Ti—Si—N nanocomposite film with microstructures having nanocrystalline grains of TiN in an amorphous matrix of SiN. The silicon is incorporated into the nanocomposite film at a concentration of typically about 6~12 at. % to provide a film hardness of typically about 30~40 GPa.

Figure 1:
FIG. 1 is a cross-section of an illustrative multi-layered superhard nanocomposite coating structure according to the present invention.

Referring initially to FIG. 1, a multi-layer superhard nanocomposite coating 8 according to the present invention includes a multi-layered coating structure 10 which is deposited on a substrate 12. The substrate 12 may be a metal such as steel, for example, or a non-metallic material such as silicon, for example, depending on the desired application. An interlayer 14, which is preferably titanium (Ti), is deposited on the substrate 12. The interlayer 14 has a thickness of typically about 0.8 µm.

A base layer 16, which is a refractory metal nitride, preferably titanium nitride (TiN), is deposited on the interlayer 14. The base layer 16 has a thickness of typically about 0.5 µm. A transition layer 18 is deposited on the base layer 16 and has a thickness of typically about 0.5 µm.

A superficial coating layer 20 is deposited on the transition layer 18 and has a thickness of typically about 1.2 µm. The superficial coating layer 20 is a two-phase refractory metal-silicon-nitride nanocomposite film with microstructures having nanocrystalline grains of refractory metal nitride in an amorphous matrix of silicon nitride (SiN). In a preferred embodiment, the superficial coating layer 20 is a two-phase Ti—Si—N nanocomposite film with microstructures having nanocrystalline grains of titanium nitride (TiN) in an amorphous matrix of silicon nitride (SiN). The silicon is incorporated into the superficial coating layer 20 at a concentration of typically about 6~12 at. %. The hardness of the multi-layer superhard nanocomposite coating 8 falls within the range of typically about 40~50 GPa.

The transition layer 18 is a refractory metal nitride with increasing concentrations of silicon progressing from the base layer 16 toward the superficial coating layer 20. In the preferred embodiment, the transition layer 18 is titanium nitride with increasing quantities of silicon progressing toward the superficial coating layer 20.

In a typical embodiment, the multi-layered coating structure 10 is fabricated on an unheated, high-speed substrate 12 using a DC reactive unbalanced magnetron sputtering physical vapor deposition (PVD) process. The process is used to sequentially deposit the interlayer 14, base layer 16, transition layer 18 and superficial coating layer 20 on the substrate 12, under process conditions which will be hereinafter described. The PVD system (not shown) is preferably a conventional, cylindrical PVD reaction chamber with four 175×380 mm, vertically-unbalanced magnetrons installed in a closed-field configuration. The substrate 12 is placed at the vertical substrate holder in the PVD reaction chamber and rotated at a speed of typically about 10 rpm. The substrate-target distance is preferably fixed at approximately 180 mm.

Figure 2:
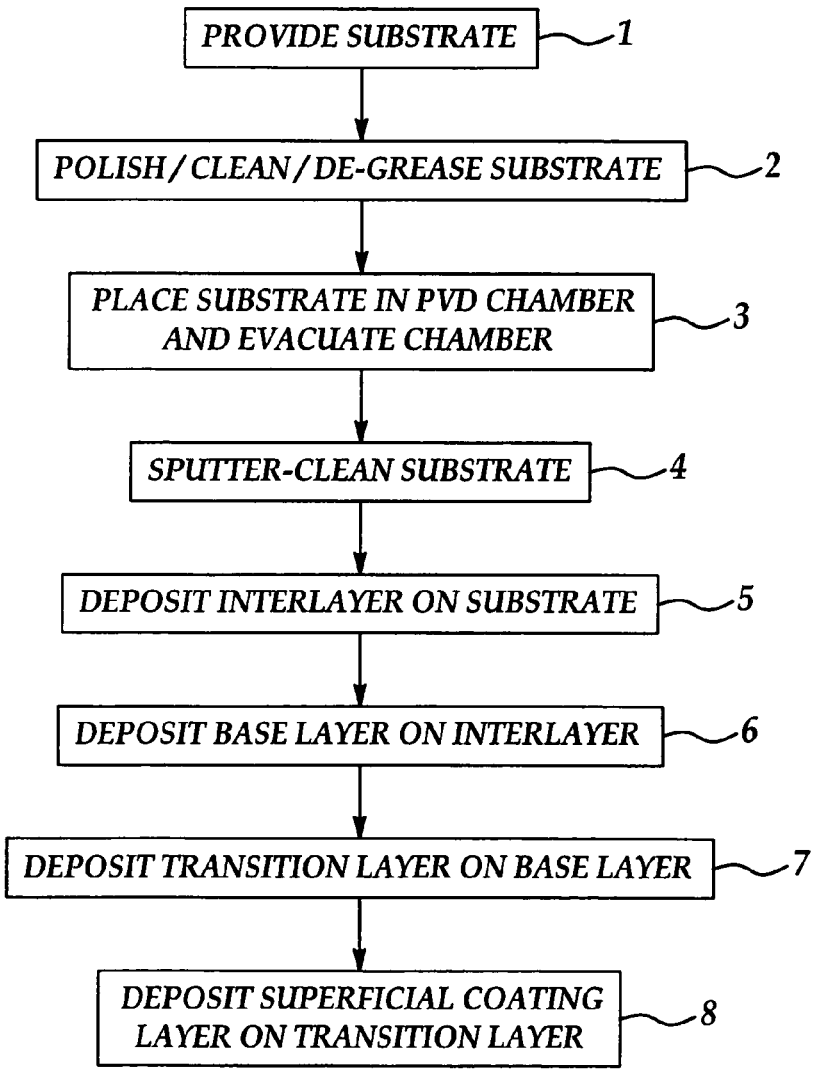
FIG. 2 is a flow diagram which summarizes sequential process steps carried out in the fabrication of a multi-layered superhard nanocomposite coating structure according to the present invention.

Referring next to FIG. 2, wherein a flow diagram which summarizes sequential process steps carried out in fabrication of the multi-layered coating structure 10 according to the present invention. In step 1, a substrate 12, which may be a metal such as steel (AISI M2, for example) or a non-metallic material such as silicon (Si 100, for example), as heretofore noted, is provided. In step 2, the substrate 12 is polished (in the case of a metal substrate) to a surface roughness of typically about 0.03 im and ultrasonically cleaned in an acetone solution for typically about 30 minutes. In the case of a silicon substrate, the substrate 12 is degreased in an ultrasonic bath with acetone and ethanol.

In step 3, the substrate 12 is placed in the PVD reaction chamber (not shown), which is then evacuated to a base pressure of typically about $2 \times 6^{-6}$ torr. In step 4, the substrate 12 is sputter-cleaned in the chamber for typically about 30 minutes in a pure argon atmosphere using a pulsed power supply. The sputter-cleaning step removes contamination from the surface of the substrate 12 prior to fabrication of the multi-layered coating structure 10 thereon.

In step 5, the interlayer 14, which is typically Ti, is deposited on the surface of the substrate 12. The interlayer 14 improves adhesion of the base layer 16, transition layer 18 and superficial coating layer 20 to the substrate 12 and reduces stresses at the interface of the coating structure 10 and the substrate 12. In step 6, the base layer 16, which is typically TiN, is deposited on the interlayer 14. In step 7, the transition layer 18, which is typically TiN with increasing concentrations of Si progressing from the base layer 16, is deposited on the base layer 16, and in step 8, the superficial coating layer 20, which is typically Ti—Si—N, is deposited on the transition layer 18. The deposition temperature for each of the layers in the process is preferably about 400 degrees C.

During deposition of the interlayer 14, base layer 16, transition layer 18 and superficial coating layer 20, the currents at the two Ti targets in the PVD reaction chamber are set to 5 A. At the Si target, currents between 0 and 2 A are used to obtain the Si content of the transition layer 18 and superficial coating layer 20. Flow of nitrogen into the PVD reaction chamber is controlled to produce a stoichiometric composition of Ti and N in the base layer 16 and of Ti, Si and N in the transition layer 18 and superficial coating layer 20. The concentration of silicon in the superficial coating layer 20 is preferably in the range of typically about 6~12 at. %.

The invention will be further understood by reference to the following example.

Example I

A multi-layered coating structure having a Ti—Si—N superficial coating layer was deposited onto an unheated AISI M2 high-speed steel substrate by DC reactive unbalanced magnetron sputtering. The deposition system was a cylindrical PVD reactor with four 175×380 mm, vertically-unbalanced magnetrons installed in a closed-field configuration. Before deposition, an AISI M2 high-speed steel (HSS) disk of 20 mm in diameter and 2 mm in thickness was polished to a surface roughness of about 0.03 im and ultrasonically cleaned in an acetone solution for 30 minutes.

The substrate was placed in the PVD reaction chamber at the vertical substrate holder, with a substrate-target distance of approximately 180 mm. Prior to deposition, the reaction chamber was evacuated to a base pressure of $2 \times 10^{-6}$ torr. The substrate was sputter-cleaned for 30 minutes in a pure argon atmosphere using a pulsed power supply to remove surface contamination from the substrate. A thin metal interlayer of Ti having a thickness of about 0.8 μm was deposited on the substrate for a period of 5 minutes to improve adhesion of the upper hard layers of the coating structure and reduce stresses at the interface with the substrate. After the changeover process, optical emission spectroscopy (OES) was set to the Ti emission line and 100% level of the monitoring signal was adjusted. The "poisoning" factor of 55% was kept constant and the flow of nitrogen into the reaction chamber was controlled to produce a stoichiometric composition.

During deposition of the interface layer, the base layer, the transition layer and the superficial coating layer, the currents at the two Ti targets in the reaction chamber were set to 5 A. At the Si target, currents of between 0 and 2 A were used to obtain a superficial coating layer having a Si content of typically about 6~12 at. %. During the deposition process, the substrate was rotated in the vertical substrate holder at a rotational speed of about 10 rpm.

Typical deposition parameters and characteristics of multiple samples of a Ti—Si—N multi-layer superhard nanocompsite coating is shown in Tables (I) and (II) below.

TABLE I

| Sample | Ti Target current (A) | Si Target current (A) | Deposition temperature (degrees C.) | Deposition rate (nm/min) | Film Thickness (μm) |
|---|---|---|---|---|---|
| TiN | 6 | 0 | 400 | 34 | 3.0 |
| 1 | 6 | 0.75 | 400 | 34 | 3.0 |
| 2 | 6 | 1.0 | 400 | 34 | 3.0 |
| 3 | 6 | 1.25 | 400 | 34 | 3.0 |
| 4 | 6 | 1.5 | 400 | 34 | 3.0 |
| 5 | 6 | 2.0 | 400 | 34 | 3.0 |
| $SiN_x$ | 0 | 3.0 | 400 | 67 | 2.0 |

TABLE II

| Sample | [Ti] (wt. %) | [Si] (wt. %) | [N] (wt. %) | Hardness (GPa) | Young's Modulus (GPa) | Elastic Recovery |
|---|---|---|---|---|---|---|
| TiN | 45.7 | 0.0 | 54.3 | 25.7 | 329.8 | 57.1 |
| 1 | 41.8 | 5.7 | 54.5 | 22.3 | 279.8 | 57.7 |
| 2 | 35.6 | 6.0 | 58.4 | 35.2 | 322.8 | 63.7 |
| 3 | 34.5 | 6.7 | 58.8 | 51.2 | 352.1 | 78.8 |
| 4 | 38.0 | 8.6 | 53.4 | 52.0 | 360.2 | 79.6 |
| 5 | 39.4 | 12.0 | 48.6 | 48.4 | 337.3 | 75.6 |
| $SiN_x$ | 0 | N/A | N/A | 29.9 | 242.7 | 67.9 |

Figure 3:
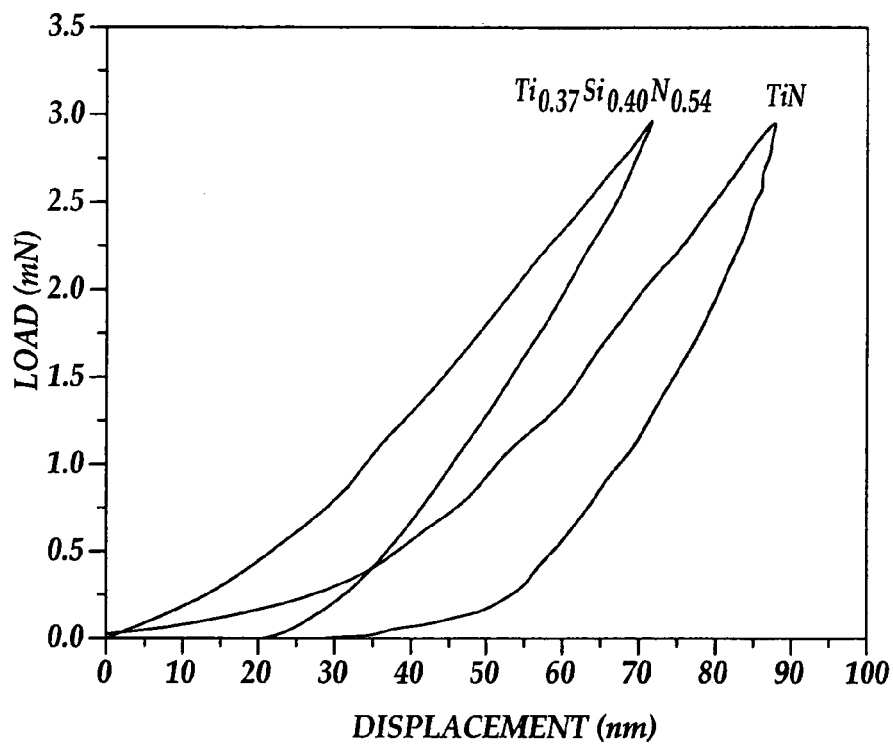
FIG. 3 is a graph of load-displacement curves wherein the hardness and elastic recovery of a Ti—Si—N nanocomposite coating according to the present invention is compared to the hardness and elastic recovery of a TiN coating.

Referring to the load-displacement curve graph of FIG. 3, wherein the hardness and elastic recovery of a Ti—Si—N multi-layer superhard nanocomposite coating according to the present invention is compared to the hardness and elastic recovery of a TiN coating deposited on a substrate under the same process conditions. According to FIG. 3, the Ti—Si—N coating exhibits a notable enhanced hardness and elastic recovery as compared to the TiN coating.

Figure 4:
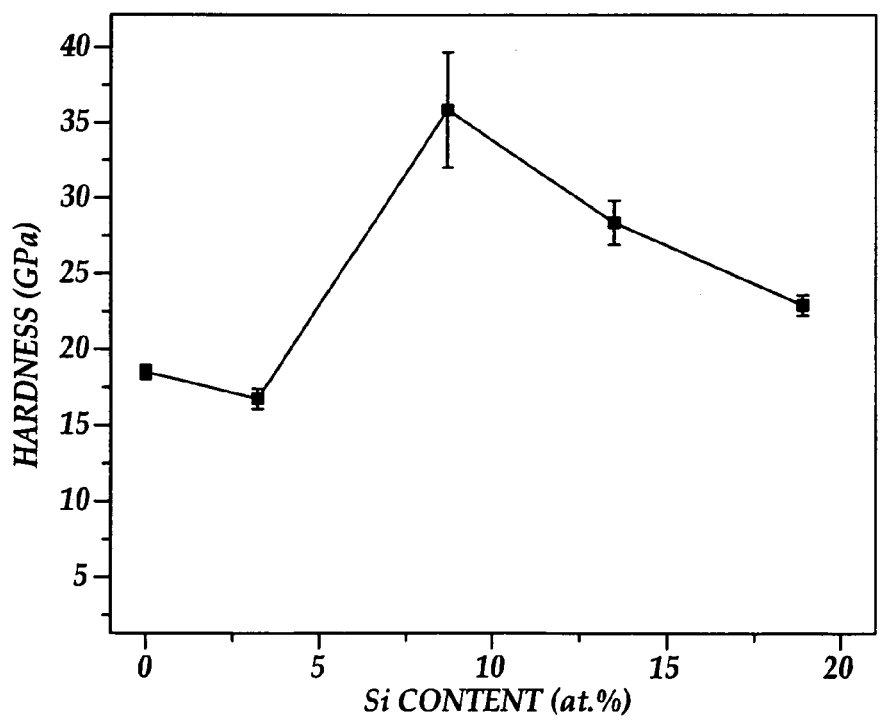
FIG. 4 is a graph which illustrates the hardness of a Ti—Si—N superhard nanocomposite coating as a function of silicon content according to the present invention.

FIG. 4 shows the hardness of the deposited Ti—Si—N multi-layer superhard nanocomposite coating as a function of silicon content by atomic percent. The hardness value was found to increase with small quantities of Si addition. The optimum hardness was measured to be about 35 GPa, with silicon content ranging from about 8 at. % to about 12 at. %. The greatly-enhanced mechanical properties of the Ti—Si—N nanocomposite coatings were considered to be due to its improved microstructure. Both the amorphous $Si_3N_4$ in the grain boundary and formation of nanocrystalline TiN are responsible for the structure transition and help to hinder the propagation of nanocracks and to reinforce the bonding of grains and grain boundaries.

Adhesion, which has been defined as a measure of the resistance of a coating to debonding or spalling, is one of the most important properties of a coating. In surface engineering, various techniques have been developed and studied for adhesion assessment of thin films. The indentation and scratch tests have been used extensively for the adhesion measurement of hard PVD and CVD coatings on steels and cemented carbides. In this study, both the Rockwell-C adhesion test and the scratch test were performed to investigate the adhesion properties of the deposited Ti—Si—N multi-layer superhard nanocomposite coatings.

In order to investigate the tribological property affected by the deposition conditions, substrate bias voltages of −50, −80 and −100 V were selected to study the relationship between deposition parameters and the adhesion properties. All the adhesion tests showed that the substrate bias voltage had significant influence on the performance of Ti—Si—N films, which induced a large delamination and spallation of coatings and caused the sharp drop of critical loads and total adhesion failure. After many repeated tests, the preliminary data reveal that good tribological performance of Ti—Si—N films with high hardness and good adhesion was achieved at a bias voltage of −50 V. It has been reported that, in the unbalanced magnetron sputter ion plating system, the ion current density (ICD) reaches a maximum level at a relatively low bias voltage; the optimum condition has been recognized as a high ion current density with low-energy bombarding ions. With the higher bias voltage, this would cause higher energy of the bombarding ions and concomitant accumulation of internal stress, which resulted in higher brittleness of the coating and bad performance in the indentation tests.

Optical micrographs taken after Rockwell-C tests on Ti—Si—N multi-layer superhard nanocomposite coatings deposited at a bias voltage of −50 V have shown that with increased silicon content, the Ti—Si—N films show a non-linear trend in their adhesion strength quality, which is consistent with their hardness variation. The best performance was found at a silicon content of 9 at. %.

Scratch tests carried out on the Ti—Si—N multi-layer superhard nanocomposite coatings of the present invention also indicate an improved adhesion property of TiN by incorporation of silicon. No flake or chip was found along the scratch track of Ti—Si—N coating samples. The friction force and AE signal during the scratching confirmed a critical load at about 75 N. As for TiN and $Si_3N_4$ coating samples subjected to the scratch tests, cracking and flaking occurred along the scratch track and the substrate was exposed for critical loads observed at 59 and 55 N, respectively.

Figure 5:
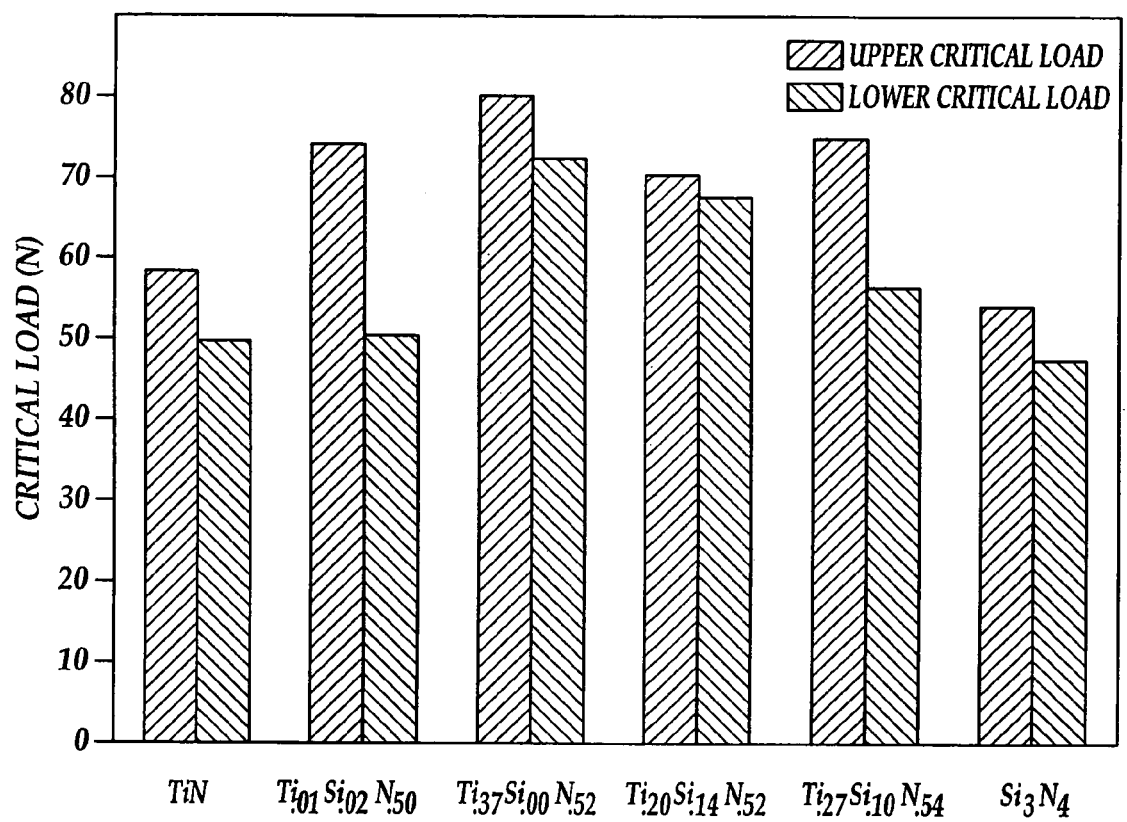
FIG. 5 is a bar graph which summarizes the variations in critical loads for a TiN coating, a Ti—Si—N superhard nanocomposite coating and a $Si_3N_4$ coating.
Figure 6A:
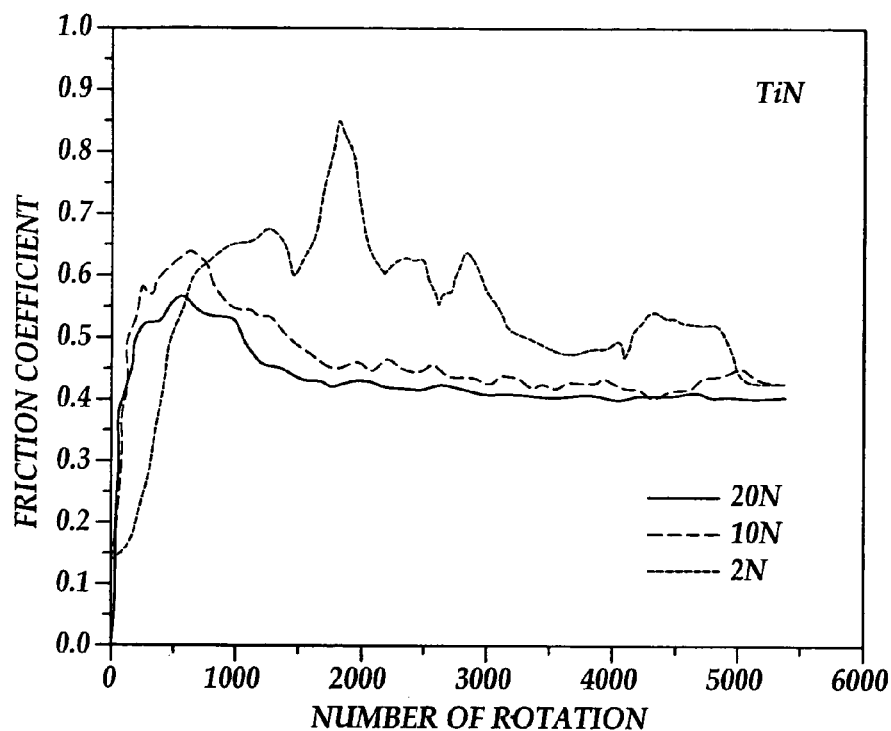
FIG. 6A is a graph which shows the variation of the coefficient of friction for a TiN coating under applied loads of 2, 10 and 20 N, respectively.
Figure 6B:
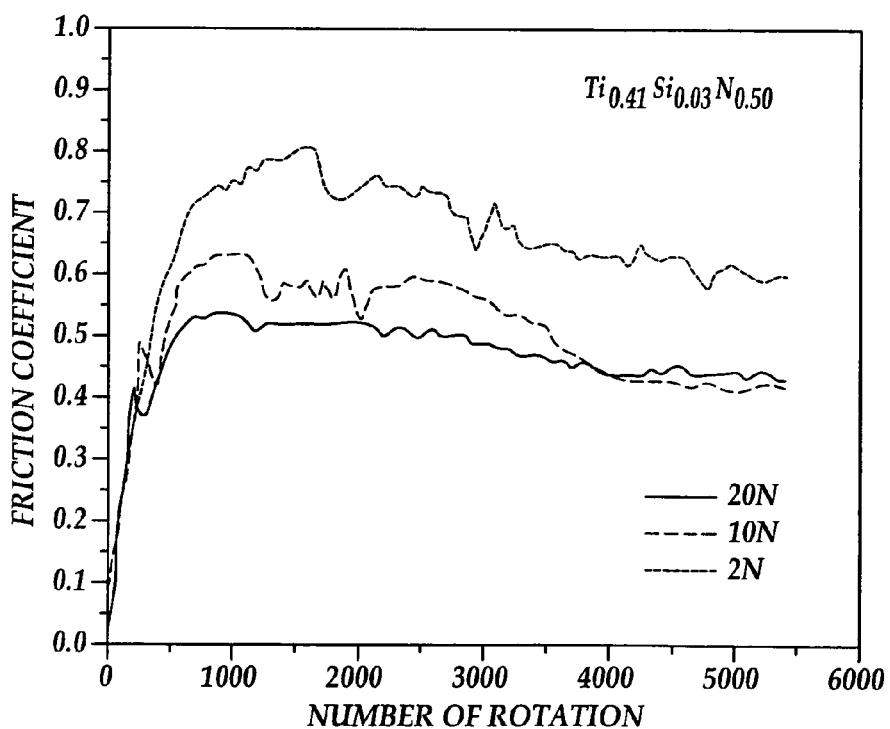
FIGS. 6B–6E are graphs which show the variation of the coefficient of friction for superhard nanocomposite Ti—Si—N coatings of the present invention under applied loads of 2, 10 and 20 N, respectively.
Figure 6C:
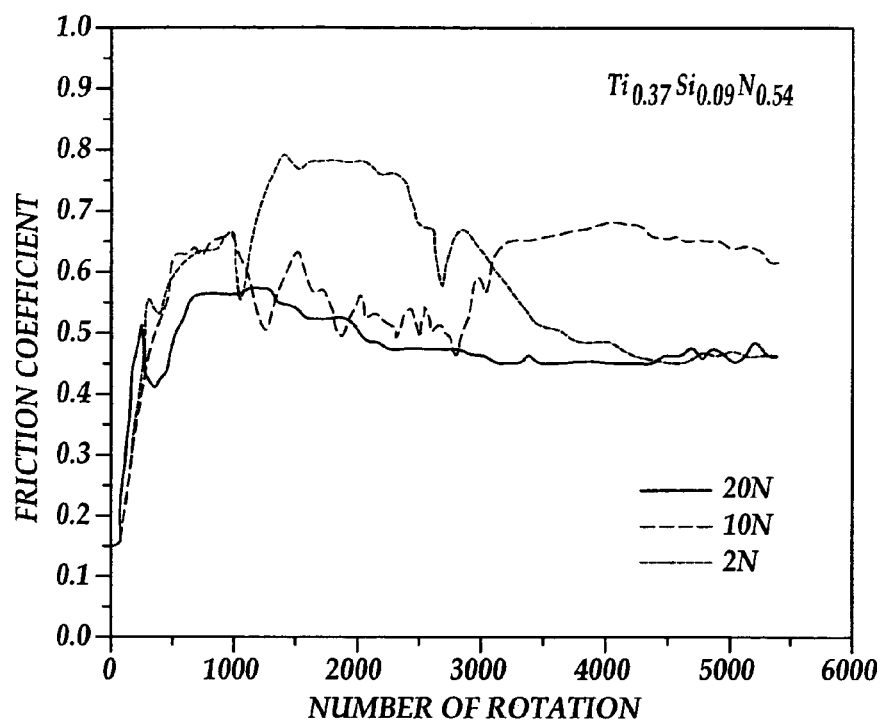
Figure 6D:
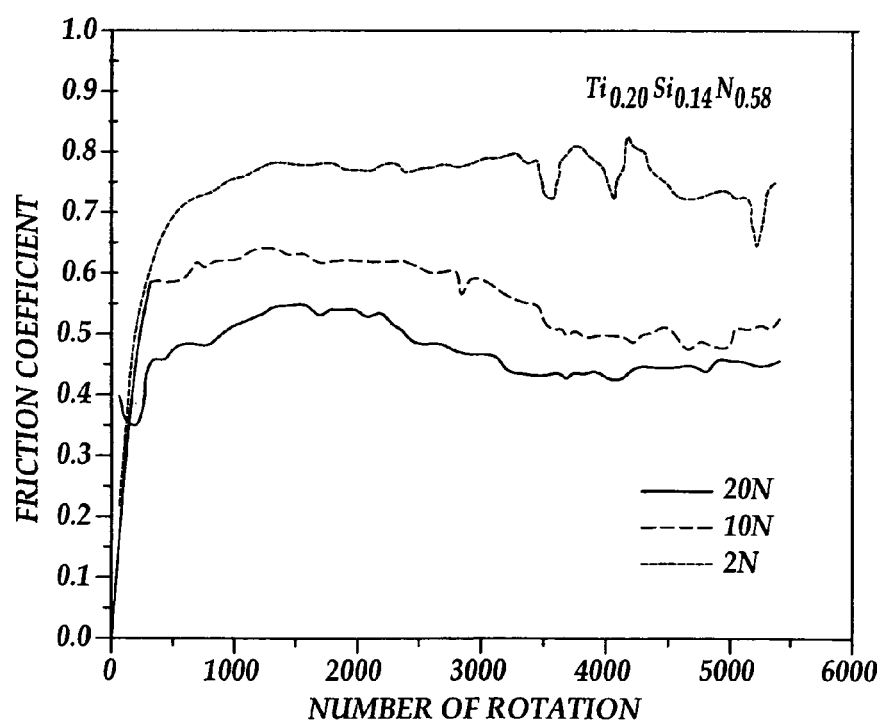
Figure 6E:
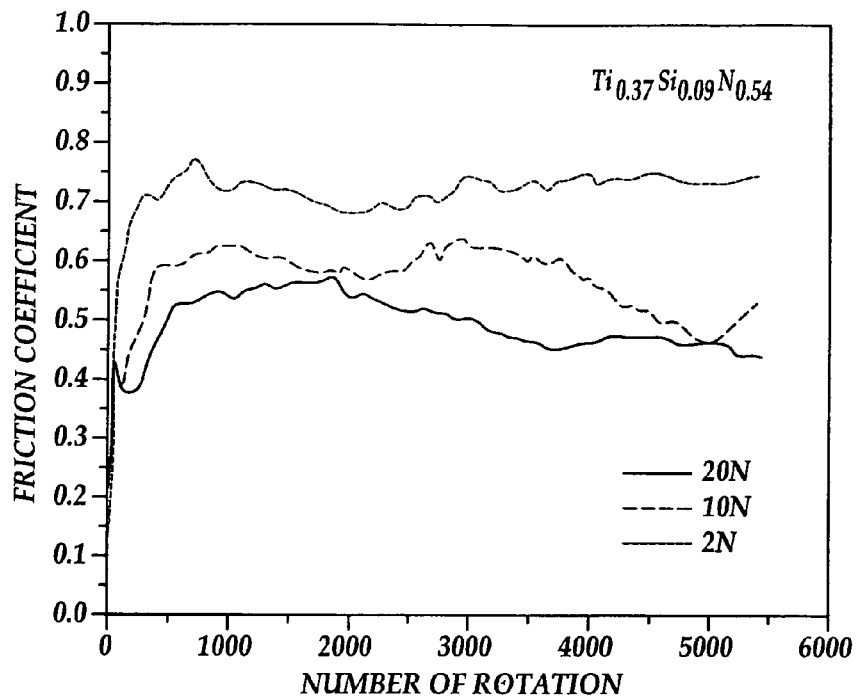

The variation in critical loads for TiN, Ti—Si—N and $Si_3N_4$ coatings are summarized in FIG. 5. The upper critical loads of Ti—Si—N coatings were found to range between 70–80 N, which are much higher than those for most of the other coatings. Remarkably, a $Ti_{0.37}Si_{0.09}N_{0.54}$ sample showed a high critical load beyond 80 N.

As evaluated by two different adhesion testing methods, the possible reasons for the resulting better adhesion for Ti—Si—N coatings are the following: (1) the formation of nanostructure reinforced the bonding at the coating substrate interface; (2) the structure modification from columnar type to a dense and fine-grained type results in a higher coating toughness and fracture resistance; (3) the higher elasticity could prevent coatings from plastic deformation during the test; and (4) the addition of silicon and the observed nanocomposite microstructure are helpful for the strain energy distribution and strongly impede the generation of cracks and defects.

Friction and wear of two contacting surfaces are a complicated phenomenon, which is sensitive to testing parameters and environmental aspects. Recently, the wear mechanism of TiN coatings deposited on different substrates against different materials has been studied by various examination techniques. Dry sliding pin-on-disc wear experiments were conducted on the Ti—Si—N coatings of the present invention, as well as on TiN coatings formed under the same process conditions, against tungsten carbide balls in order to investigate the friction behavior and wear resistance of Ti—Si—N coatings.

FIGS. 6A–6E show variations in the coefficient of friction for TiN and Ti—Si—N coatings under applied loads of 2, 10 and 20 N, respectively. At the lowest load of 2N, the TiN coating (FIG. 6A) shows a highly unstable friction behavior with a friction coefficient value of about 0.5–0.8. With increasing silicon content, the Ti—Si—N coatings exhibit a more stable type of friction and wear behavior, especially for the samples shown in FIGS. 6C and 6D. The sample shown in FIG. 6C exhibits a relatively steady value of about 0.7 throughout the test. Friction behavior of Ti—Si—N coatings can reflect the complete transition from the initial break-in behavior to a steady state, post break-in roughness referred to as equilibrium roughness. Crystallographic reorientation can produce a reduction in the effective shear stress in near-surface region and a reduction of friction:

As the load was increased to 10 N and 20 N, the friction coefficient decreased to a low value (0.5~0.6) for all coatings. For the TiN coating, shown in FIG. 6A, it was observed that the value of the friction coefficient decreased abruptly to 0.4 after 1,000 cycles, indicating the complete delamination of the film and exposure of the substrate. However, for the Ti—Si—N coatings (FIGS. 6B–6D), the lives of coatings were prolonged to 3,000–4,000 cycles.

Figure 7:
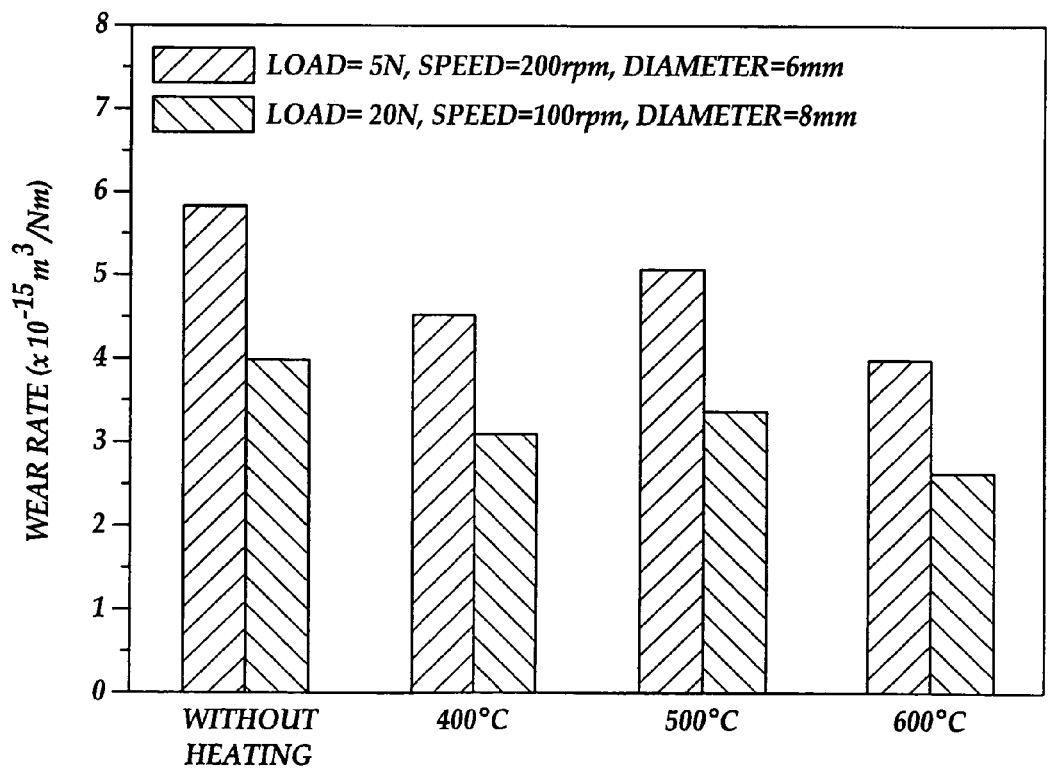
FIG. 7 is a bar graph which summarizes the wear rates for a superhard nanocomposite Ti—Si—N coating of the present invention and a $Si_3N_4$ film at various applied loads.

The wear rate for Ti—Si—N coatings (8.61 at. % Si) deposited at various deposition temperatures and subjected to various ball-on-disc test conditions are indicated in the bar graph of FIG. 7. According to the graph, the wear rate was highest under both the 5 N and 20 N test conditions for the coating deposited at room temperature. The wear rate under both test conditions was lowest for the coating deposited at 600 degrees C.

Figure 8:
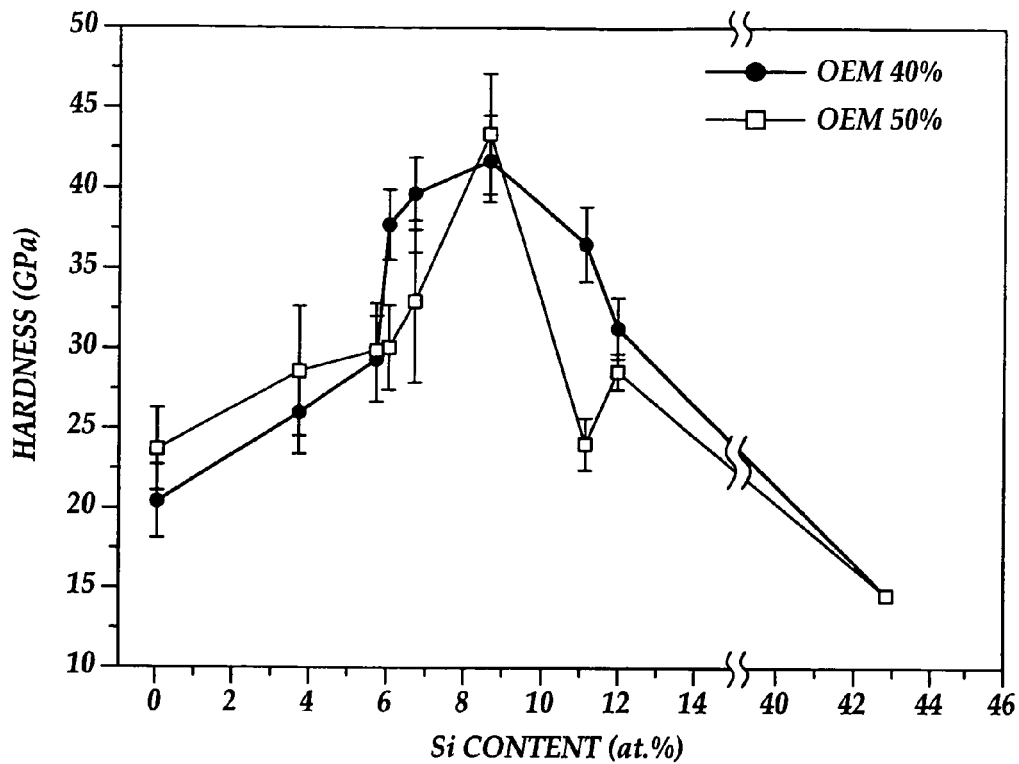
FIG. 8 is a line graph wherein hardness of a coating exceeding 30 GPa is correlated with the silicon content (at. %) of the coating.

FIG. 8 is a line graph wherein hardness of a Ti—Si—N superhard nanocomposite coating of the present invention is plotted vs. the silicon content of the coating in atomic percent. According to the graph, the maximum hardness achieved for the Ti—Si—N superhard nanocomposite coating exceeded 30 GPa with a silicon content in the range of about 6~12 at. %.

Figure 9:
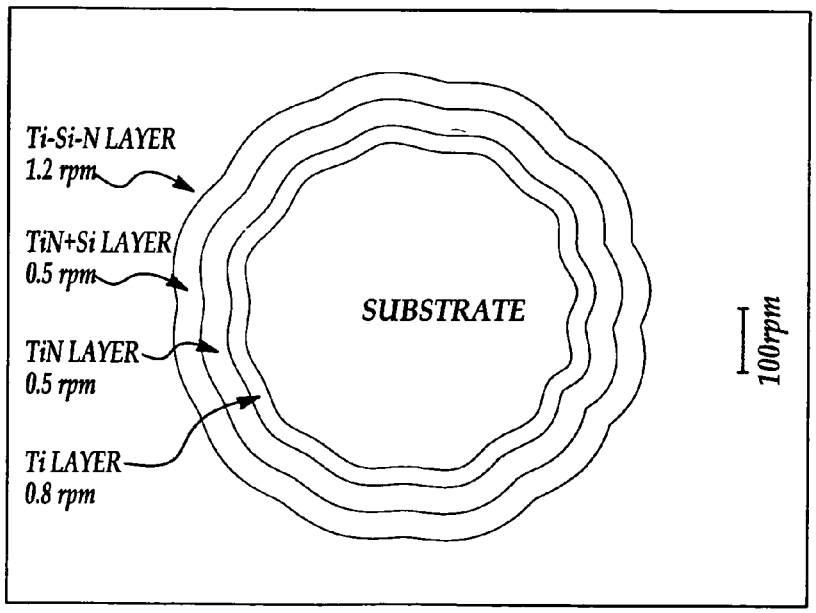
FIG. 9 is an optical micrograph of a multilayered superhard nanocomposite coating according to the present invention, illustrating typical thicknesses of the various layers.

FIG. 9 is an optical micrograph of a typical embodiment of a multi-layered superhard nanocomposite coating according to the present invention. As shown in the micrograph, the coating typically includes a Ti layer of about 0.8 μm; a TiN layer of typically about 0.5 μm; a TiN+Si layer of typically about 0.5 μm; and a Ti—Si—N layer of typically about 1.2 μm.

Figure 10:
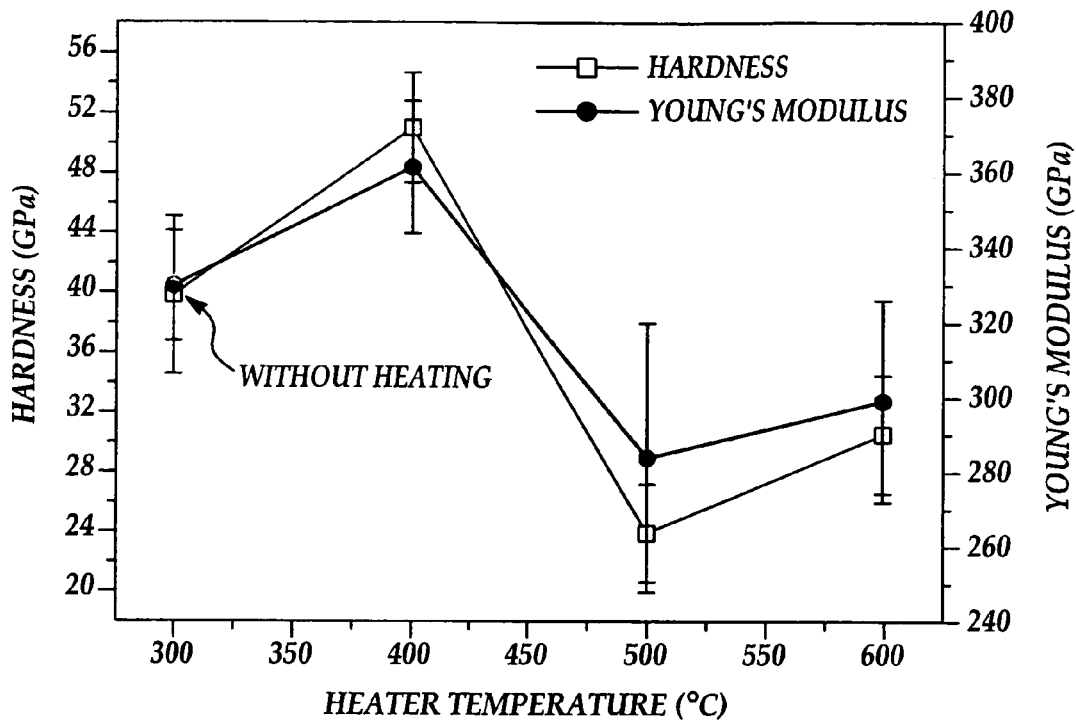
FIG. 10 is a line graph wherein hardness and Young's modulus of the superhard nanocomposite Ti—Si—N coatings of the present invention are plotted as a function of deposition temperature.

FIG. 10 is a line graph wherein hardness and Young's modulus of Ti—Si—N coatings (8.61 at. % Si) is plotted as a function of deposition temperature. According to the graph, the deposition temperature which produces the optimum hardness and Young's modulus for the coatings is in the range of about 350 degrees C. to about 450 degrees C., and preferably, about 400 degrees C.

Figure 11:
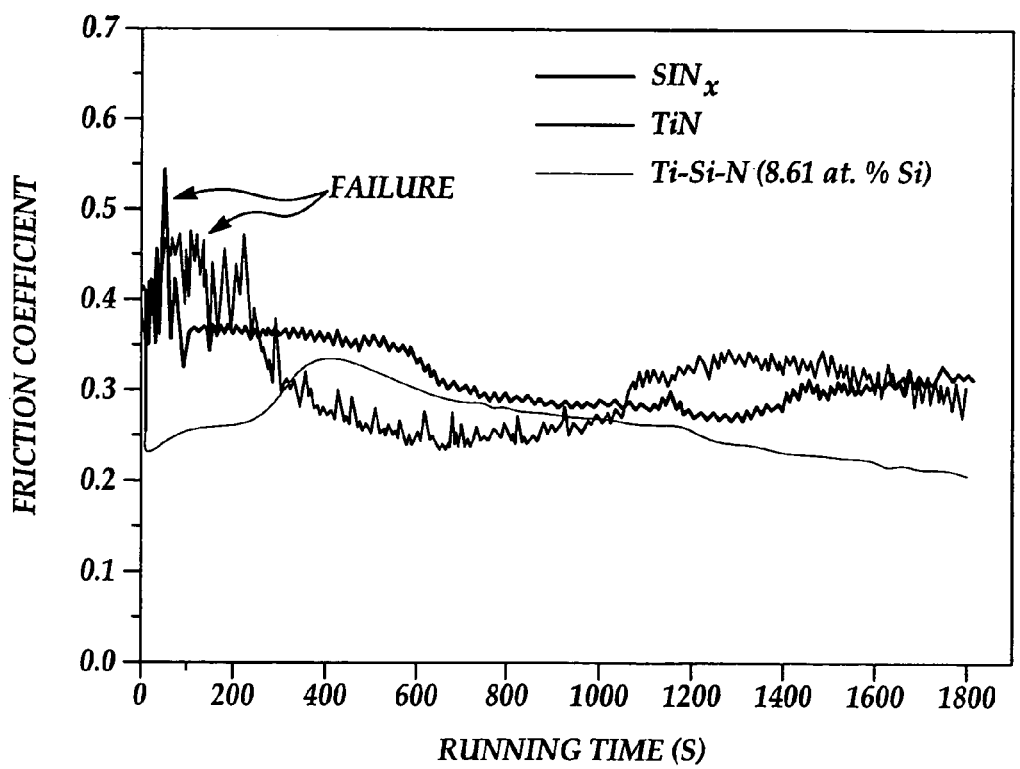
FIG. 11 is a line graph wherein friction coefficient is plotted vs. running time of TiN, Ti—Si—N and $SiN_x$ coatings under various loads.

FIG. 11 is a line graph wherein friction temperature is plotted vs. running time of TiN, Ti—Si—N (8.61 at. % Si), and $SiN_x$ coatings under the following conditions: (a) load—5 N, speed—200 rpm, diameter—6 mm; and (b) load—20 N, speed—100 rpm, and diameter—8 mm. The graph indicates substantial friction reduction and stability for the Ti—Si—N coating as compared to the TiN coating under the same conditions.

While the preferred embodiments of the invention have been described above, it will be recognized and understood that various modifications can be made in the invention and the appended claims are intended to cover all such modifications which may fall within the spirit and scope of the invention.

The invention claimed is:

1. A superhard nanocomposite coating on a machining tool substrate comprising:
   a refractory metal silicon nitride coating layer consisting essentially of nanometer size particles of crystalline refractory metal nitride in a matrix of amorphous silicon nitride, the nanocomposite coating having silicon in a concentration of from about 6 atomic percent to about 12 atomic percent; the nanocomposite coating layer being separated from the substrate by an interfacial layer consisting essentially of refractory metal on the substrate, a base layer consisting essentially of refractory metal and nitrogen on the interfacial layer, and a transition layer consisting essentially of refractory metal, silicon and nitrogen on the base layer, the nanocomposite layer being on the transition layer.

2. The superhard nanocomposite coating of claim 1 wherein said refractory metal is titanium, and the thickness of the nanocomposite coating layer is in the range of one to two micrometers.

3. The superhard nanocomposite coating of claim 1 wherein said silicon is present in said nanocomposite, silicon nitride containing coating layer in a concentration of from about 8 atomic percent to about 12 atomic percent.

4. The superhard nanocomposite coating of claim 3 wherein said refractory metal is titanium and the thickness of the nanocomposite coating layer is in the range of one to two micrometers.

5. The superhard nanocomposite coating of claim 1 wherein said refractory metal is tantalum or tungsten.

6. The superhard nanocomposite coating of claim 5 wherein said silicon is present in said nanocomposite, silicon nitride containing coating layer in a concentration of from about 8 atomic percent to about 12 atomic percent.

7. The superhard nanocomposite coating of claim 3 wherein said silicon is present in said silicon nitride coating layer in a concentration of at least about 9 atomic percent.

8. The superhard nanocomposite coating of claim 7 wherein said refractory metal is titanium, tantalum or tungsten.

9. A superhard nanocomposite coating on a machining tool substrate, comprising:
a multi-layered coating structure including a superficial coating layer consisting essentially of nanometer size particles of crystalline titanium nitride in a matrix of amorphous silicon nitride, the superficial coating layer comprising silicon in a concentration of from about 6 atomic percent to about 12 atomic percent; the nanocomposite coating layer being separated from the substrate by a micrometer scale thick interfacial layer consisting essentially of titanium on the substrate, a micrometer scale thick base layer consisting essentially of titanium nitride on the interfacial layer, and a micrometer scale thick transition layer consisting essentially of titanium, silicon and nitrogen on the base layer, the superficial coating layer being on the transition layer.

10. The superhard nanocomposite coating of claim 9 wherein said silicon is present in said superficial coating layer in a concentration of from about 8 atomic percent to about 12 atomic percent.

11. The superhard nanocomposite coating of claim 10 wherein said silicon is present in said superficial coating layer in a concentration of at least about 9 atomic percent.

* * * * *